(12) United States Patent
McClain et al.

(10) Patent No.: US 11,073,925 B1
(45) Date of Patent: Jul. 27, 2021

(54) TOUCH SCREEN ELECTRICAL BOX

(71) Applicants: Coy McClain, Whitesburg, KY (US); Billy Shepherd, Whitesburg, KY (US)

(72) Inventors: Coy McClain, Whitesburg, KY (US); Billy Shepherd, Whitesburg, KY (US)

( * ) Notice: Subject to any disclaimer, the term of this patent is extended or adjusted under 35 U.S.C. 154(b) by 0 days.

(21) Appl. No.: 16/661,162

(22) Filed: Oct. 23, 2019

(51) Int. Cl.
G06F 3/041 (2006.01)
G06F 3/0488 (2013.01)
H02B 1/24 (2006.01)
H02H 9/02 (2006.01)
H05K 7/14 (2006.01)
H01H 71/04 (2006.01)

(52) U.S. Cl.
CPC ............ *G06F 3/041* (2013.01); *G06F 3/0488* (2013.01); *H01H 71/04* (2013.01); *H02B 1/24* (2013.01); *H02H 9/02* (2013.01); *H05K 7/1427* (2013.01)

(58) Field of Classification Search
CPC ...................................................... H02B 1/24
See application file for complete search history.

(56) References Cited

U.S. PATENT DOCUMENTS

| | | |
|---|---|---|
| 5,743,859 A | 4/1998 | Wodlinger et al. |
| 7,964,989 B1 | 6/2011 | Puschnigg et al. |
| 9,013,283 B1 | 4/2015 | Tackaberry |
| 9,215,779 B2 | 12/2015 | Restrepo et al. |
| 9,329,625 B2 | 5/2016 | Park et al. |
| 9,342,202 B2 | 5/2016 | Keskin et al. |
| 9,679,711 B1 | 6/2017 | Rintz |
| 9,784,468 B2 | 10/2017 | Bisson et al. |
| 9,814,121 B2 | 11/2017 | Langdon, II |
| 2002/0153978 A1* | 10/2002 | Greenberg ......... H01H 71/1009 335/8 |
| 2008/0077280 A1* | 3/2008 | DeBoer ................ H05B 47/155 700/295 |
| 2011/0245940 A1 | 10/2011 | Picco |
| 2017/0366017 A1* | 12/2017 | Clay .................... H02J 7/1415 |

* cited by examiner

*Primary Examiner* — Gustavo Polo
(74) *Attorney, Agent, or Firm* — Cramer Patent & Design, PLLC; Aaron R. Cramer

(57) ABSTRACT

A power distribution box having a touch screen display on the exterior panel is configured to permit a user to monitor each fuse or circuit breaker contained within the power distribution box. A user may activate or deactivate a given fuse or circuit breaker by touching the corresponding image on the touch screen.

16 Claims, 6 Drawing Sheets

TOUCH SCREEN ELECTRICAL BOX

RELATED APPLICATIONS

Not applicable.

FIELD OF THE INVENTION

The present invention relates to electrical boxes and specifically touch screen electrical boxes.

BACKGROUND OF THE INVENTION

Among the many dangers present in any home, the risk of injury or death caused by accidents involving electricity and electrical devices is among the most common. The common power distribution panel in a home or business provides all associated branch circuits with disconnecting ability, over-current protection, short circuit protection, ground fault protection, and in some even cases arc-fault protection. It provides this by using circuit breakers in newer installations or fuses that were commonly used years ago. To disconnect or energize branch circuits connected to such panels, the user must open the panel door and physically touch the circuit breaker or fuse. While normally a safe process, accidents do happen and the user may be exposed to lethal levels of energy. Accordingly, there exists a need for a means by which users accessing a power distribution panel can be protected from physical dangers. The development of the touch screen electrical box fulfills this need.

SUMMARY OF THE INVENTION

The inventor has recognized the aforementioned, inherent problems and lack in the art and observed that there is a need for an electrical distribution panel with touch screen control device comprising a front face which is attached to a rear box by a plurality of fasteners. The rear box is face mounted on a wall. The device also comprises one or more ventilation openings located at an upper end of a touch screen display. The touch screen display is provided with a rear panel assembly on an interior of the rear box and is attached to the front face. The device also comprises a plurality of knockouts allowing for passage of a branch circuit and control wiring, a pair of electric fans disposed on a bottom of the rear box and a wiring interface unit disposed on the interior of the front face which accepts incoming power feeds. The wiring interface unit provides for monitoring and control of a plurality of outgoing branch circuit and control wiring. A plurality of incoming power wiring enters the rear box from its top and accesses the wiring interface unit. The electric fans receive power from the wiring interface unit. The pair of electric fans may work with a pair of the ventilation openings at the top of the rear box to provide adequate air flow for cooling of the wiring interface unit as well as the rear panel assembly. The device may also comprise a main circuit icon located at the top of the screen display; a plurality of ON/OFF icons displayed for the main circuit icon and a plurality of branch circuit icons; a fault icon indicating a plurality of circuits that display abnormal loads and a center graphical display area providing indication.

The electrical distribution panel with touch screen control may allow access through the touch screen display. The fasteners may be a plurality of machine screws while an interior of the rear box is only intended for access by one or more electricians. The one or more opposite ventilation openings may be disposed on a far side of the rear box. The wiring interface unit is interconnected to the rear panel assembly by use of a quick release electrical connector to allow for disconnection of the touch screen display.

The wiring interface unit may be interconnected to the rear panel assembly by use of the quick release electrical connector to allow for disconnection of the rear panel assembly when the front face needs to be accessed. The touch screen display may be connected to the wiring interface unit via the interconnect cable and the quick release electrical connector. The incoming power wiring may be phase wiring selected from the group consisting of a single phase wiring, a split phase wiring, or a three-phase wiring. The outgoing branch wiring may be connected to the wiring interface unit as one or more non-grounded conductors.

The outgoing branch wiring may be connected to a neutral connection terminal and a ground connection terminal. The neutral connection terminal and the ground connection terminal are bonded together if the electrical distribution panel serves as a service entrance. The wiring interface unit may provide over-current protection for the outgoing branch wiring. The wiring interface unit may provide ground-fault protection for the outgoing branch wiring. The wiring interface unit may also provide arc-fault protection for the outgoing branch wiring. The wiring interface unit may also provide disconnecting means for the outgoing branch wiring.

The abnormal loads may be selected from the group consisting of overloads, short circuits, ground fault imbalances, or arc-fault signatures. The fault icon may be a prominent color. The center graphical display area may provide indication such as circuit feed designation. The center graphical display area may provide indication such as fault condition.

BRIEF DESCRIPTION OF THE DRAWINGS

The advantages and features of the present invention will become better understood with reference to the following more detailed description and claims taken in conjunction with the accompanying drawings, in which like elements are identified with like symbols, and in which:

Figure 1:
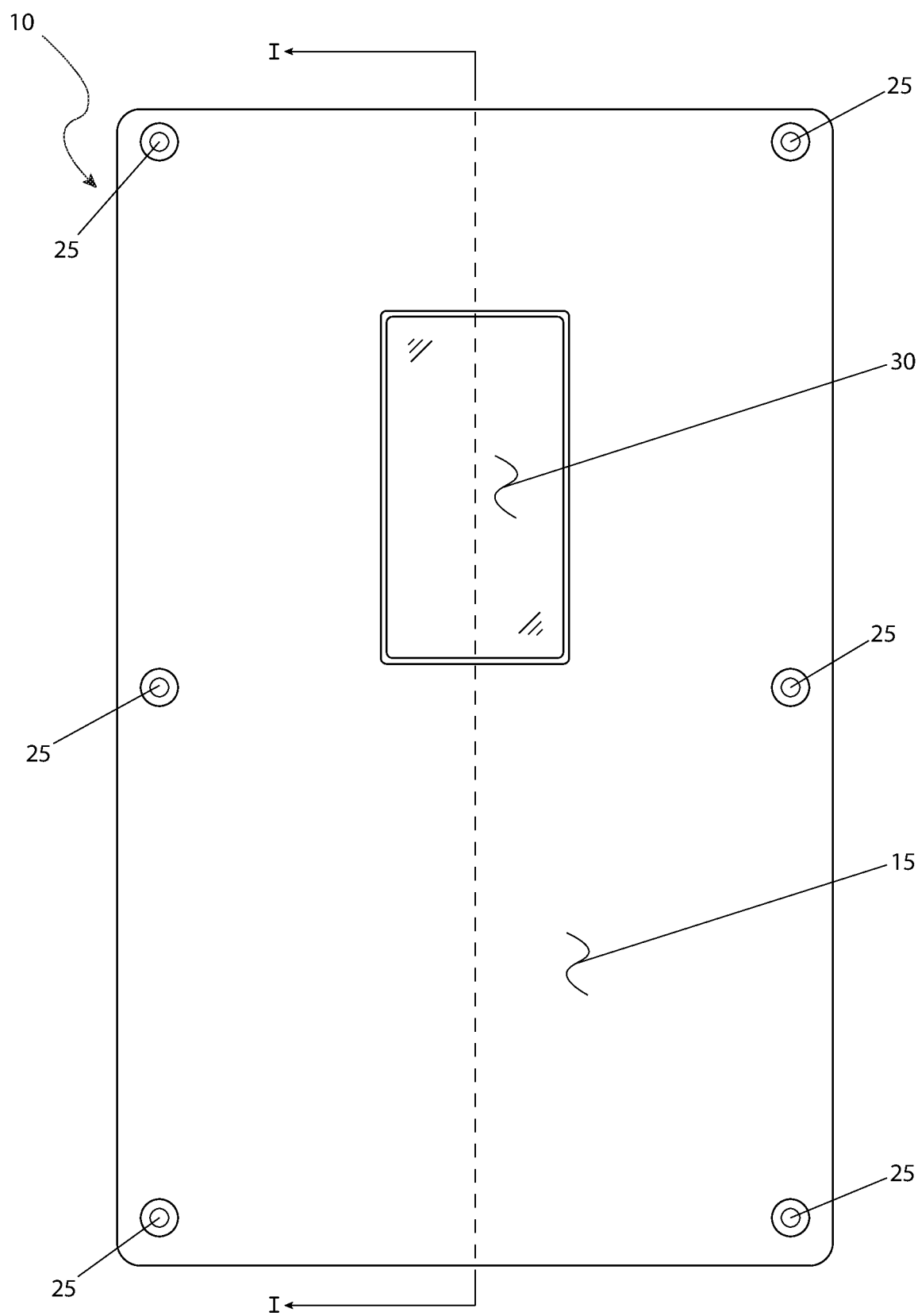
FIG. 1 is a front view of the electrical distribution panel with touch screen control 10, according to the preferred embodiment of the present invention; and, FIG. 2 is a side view of the electrical distribution panel with touch screen control 10, according to the preferred embodiment of the present invention; and, FIG. 3 is a sectional view of the electrical distribution panel with touch screen control 10, as seen along a line I-I, as shown in FIG. 1, according to the preferred embodiment of the present invention; and, FIG. 4 is a sectional view of the electrical distribution panel with touch screen control 10, as seen along a line II-II, as shown in FIG. 2, according to the preferred embodiment of the present invention; and, FIG. 5 is an electrical block diagram of the electrical distribution panel with touch screen control 10, according to the preferred embodiment of the present invention; and, FIG. 6 is a pictorial representation of the touch screen display 30 as used with the electrical distribution panel with touch screen control 10, according to the preferred embodiment of the present invention.

DESCRIPTIVE KEY 10 electrical distribution panel with touch screen control
15 front face 20 rear box
25 fasteners
30 touch screen display
35 ventilation opening(s)
40 knockouts
45 rear panel assembly
50 electric fan(s)
55 wiring interface unit
60 interconnect cable
65 quick release electrical connector
70 incoming power wiring
75 outgoing branch wiring
80 neutral connection terminal
85 ground connection terminal
90 main circuit icon
95 screen display
100 ON/OFF icons
105 branch circuit icons
110 fault icon
115 center graphical display

DESCRIPTION OF THE PREFERRED EMBODIMENTS

The best mode for carrying out the invention is presented in terms of its preferred embodiment, herein depicted within FIGS. 1 through 5. However, the invention is not limited to the described embodiment, and a person skilled in the art will appreciate that many other embodiments of the invention are possible without deviating from the basic concept of the invention and that any such work around will also fall under scope of this invention. It is envisioned that other styles and configurations of the present invention can be easily incorporated into the teachings of the present invention, and only one particular configuration shall be shown and described for purposes of clarity and disclosure and not by way of limitation of scope. All of the implementations described below are exemplary implementations provided to enable persons skilled in the art to make or use the embodiments of the disclosure and are not intended to limit the scope of the disclosure, which is defined by the claims.

The terms "a" and "an" herein do not denote a limitation of quantity, but rather denote the presence of at least one of the referenced items.

1. DETAILED DESCRIPTION OF THE FIGURES

Referring now to FIG. 1, a front view of the electrical distribution panel with touch screen control 10, according to the preferred embodiment of the present invention is disclosed. The electrical distribution panel with touch screen control 10 (herein also described as the "panel") 10, consists of a front face 15 attached to a rear box 20 (not shown in this FIGURE due to illustrative limitations) by a series of at least four (4) fasteners 25 such as machine screws. Depending on the size of the electrical distribution panel with touch screen control 10, dictated by the number of branch circuits serve, more fasteners 25 may be required such as the six (6) as shown here. The electrical distribution panel with touch screen control 10 is used to replace the conventional load center panel as found in a residence, business, or other installation. The electrical distribution panel with touch screen control 10 does not allow for normal interior user access, only control access through a touch screen display 30. As such, there is no hinged door, nor any normal access to a breaker, fuse, or other over-current device which may cause physical harm in the event of a malfunction. The interior of the rear box 20 is only intended for access by electricians or other qualified individuals.

Figure 2:
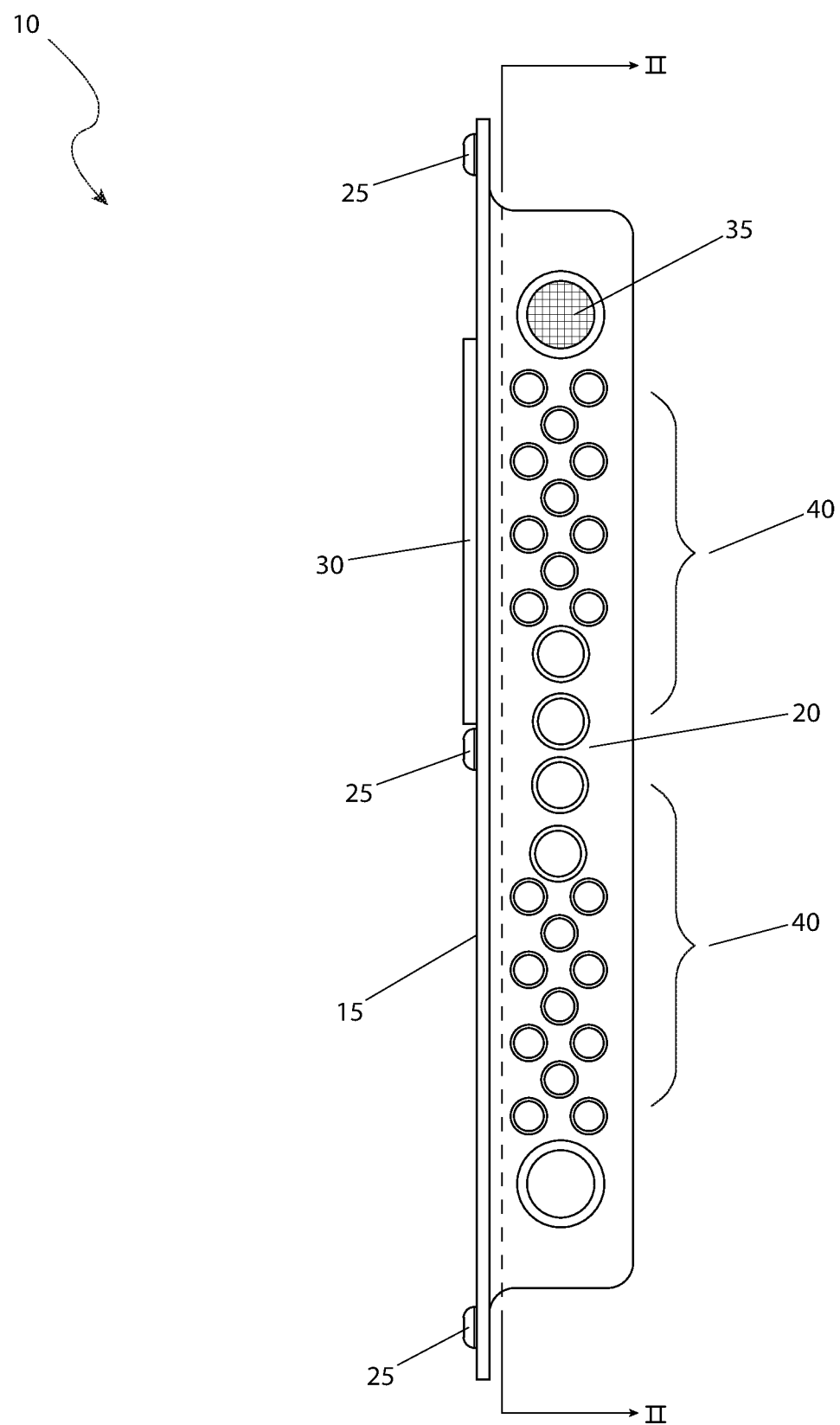

Referring next to FIG. 2, a side view of the electrical distribution panel with touch screen control 10, according to the preferred embodiment of the present invention is depicted. The front face 15 remains visible along with a side view of the touch screen display 30. The rear box 20 is suitable for flush or face mounting in a wall as customarily expected. A ventilation opening(s) 35 is located at the upper end of the touch screen display 30. A series of knockouts 40 allow for passage of branch circuit and control wiring as needed.

Figure 3:
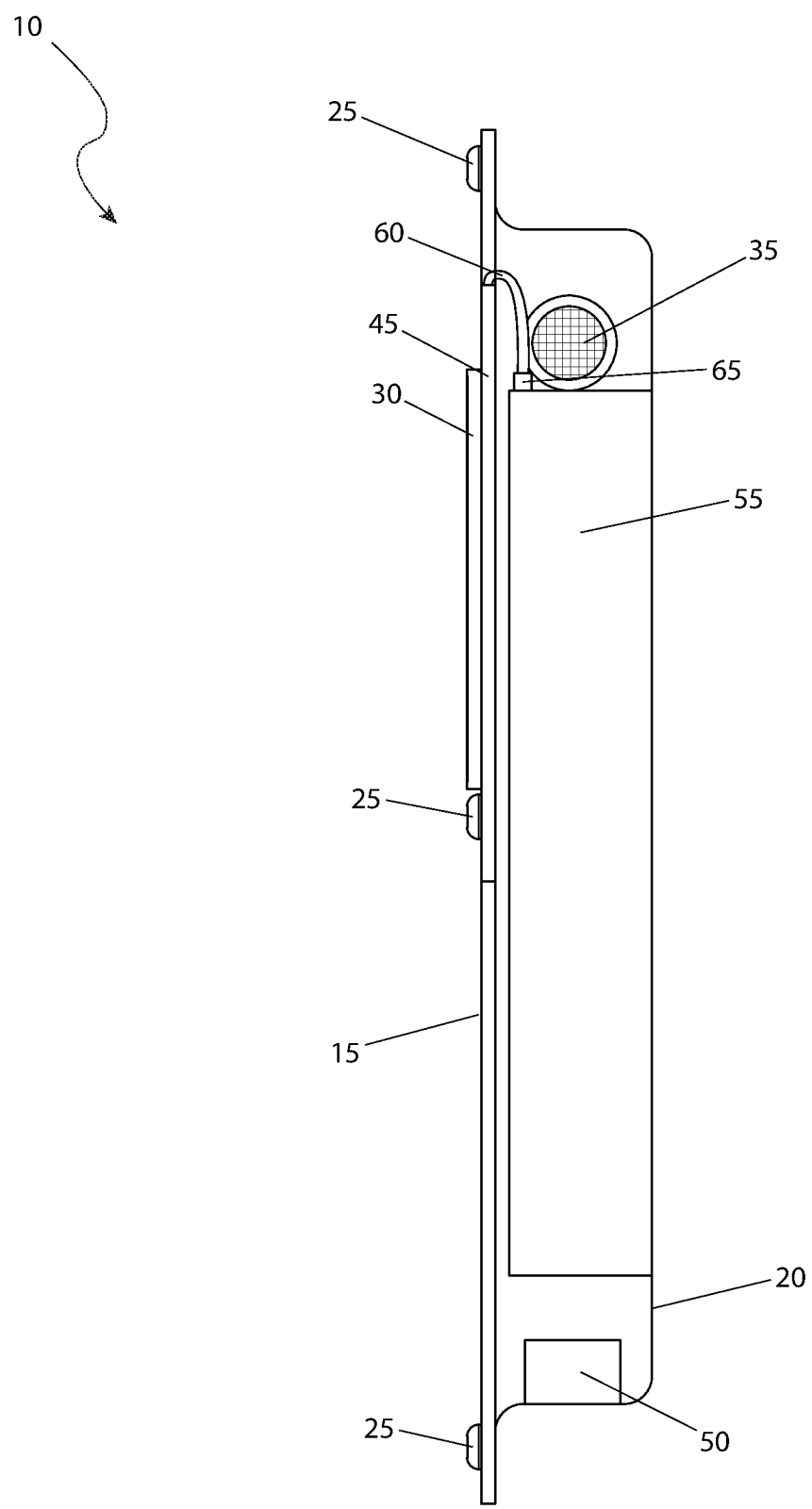

Referring now to FIG. 3, a sectional view of the electrical distribution panel with touch screen control 10, as seen along a line I-I, as shown in FIG. 1, according to the preferred embodiment of the present invention is shown. The touch screen display 30 is provided with a rear panel assembly 45 on the interior of the rear box 20, but attached to the front face 15. The opposite ventilation opening(s) 35 is visible on the far side of the rear box 20. Air flow is provided by two (2) electric fan(s) 50, of which only one (1) is visible due to illustrative limitations. A wiring interface unit 55 is visible on the interior of the front face 15 which accepts incoming power feeds. The wiring interface unit 55 also provides for monitoring and control of outgoing branch wiring as will be shown in greater detail herein below. The wiring interface unit 55 is interconnected to the rear panel assembly 45 by use of a quick release electrical connector 65 to allow for disconnection of the touch screen display 30 and rear panel assembly 45 when the front face 15 needs to be accessed by an electrician or authorized individual.

Figure 4:
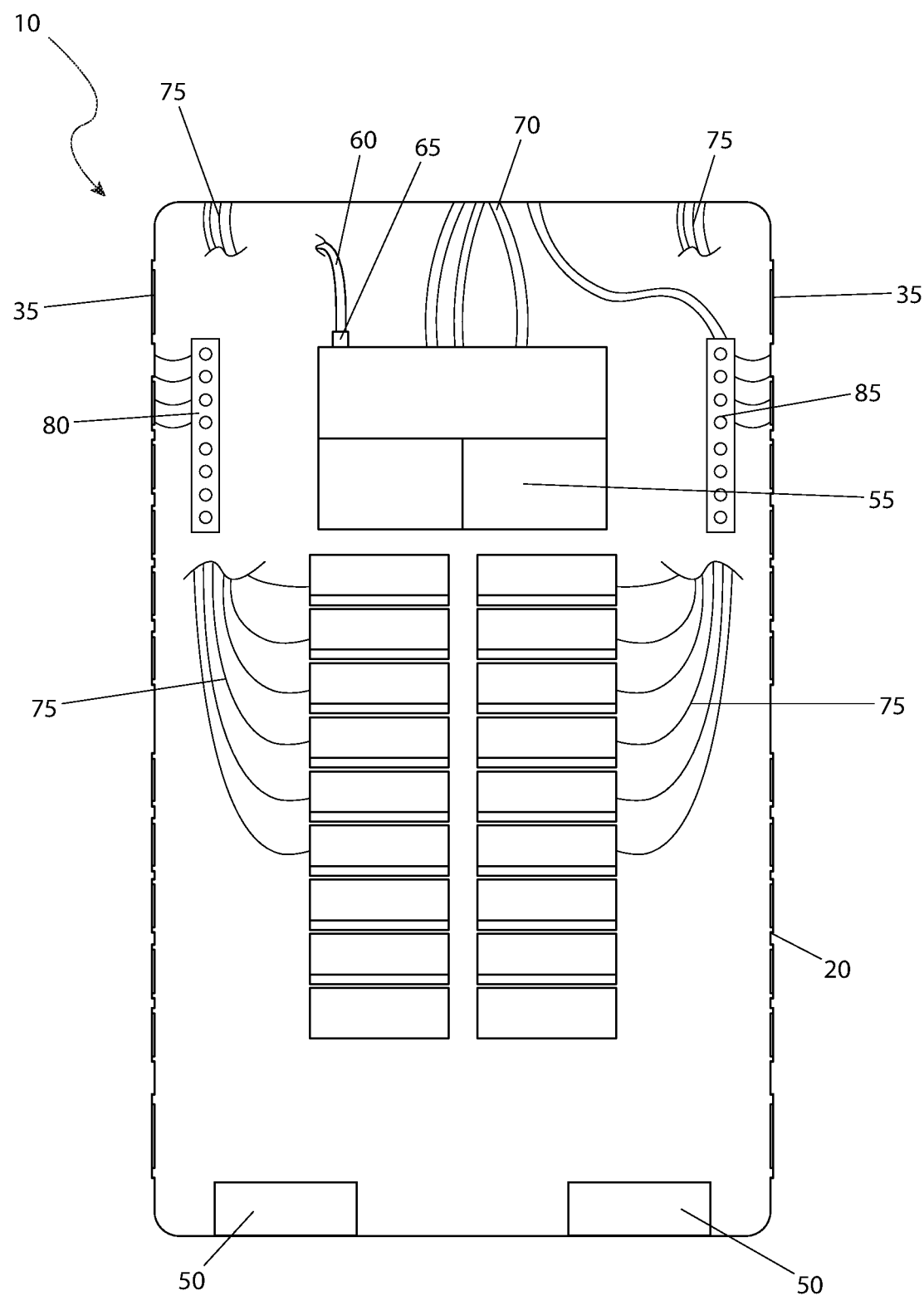

Referring next to FIG. 4, a sectional view of the electrical distribution panel with touch screen control 10, as seen along a line II-II, as shown in FIG. 2, according to the preferred embodiment of the present invention is disclosed. Said view provides information on the overall interconnections to the wiring interface unit 55. Incoming power wiring 70 are shown entering the rear box 20 from the top and accessing the wiring interface unit 55. It is envisioned that the incoming power wiring 70 can be single phase, split phase, or three-phase. The type, voltage, and ampacity of the incoming power wiring 70 is not viewed as a limiting factor of the present invention. Outgoing branch wiring 75 are also depicted connecting to the wiring interface unit 55 as non-grounded conductors (Hot) conductors. The outgoing branch wiring 75 also connects to a neutral connection terminal 80 and a ground connection terminal 85. The neutral connection terminal 80 and ground connection terminal 85 may be bonded together if the panel 10 serves as a service entrance. The two (2) electric fan(s) 50 are shown at the bottom of the rear box 20 where they work with the two (2) ventilation opening(s) 35 at the top of the rear box 20 to provide adequate air flow for cooling of the wiring interface unit 55 as well as the rear panel assembly 45 (as shown in FIG. 3) The interconnect cable 60 (partially shown), along with its associated—65—connects to the top of the wiring interface unit 55. The wiring interface unit 55 provides all over-current, ground-fault protection, arc-fault protection, disconnecting means, and other electrical protection for the outgoing branch wiring 75.

Figure 5:
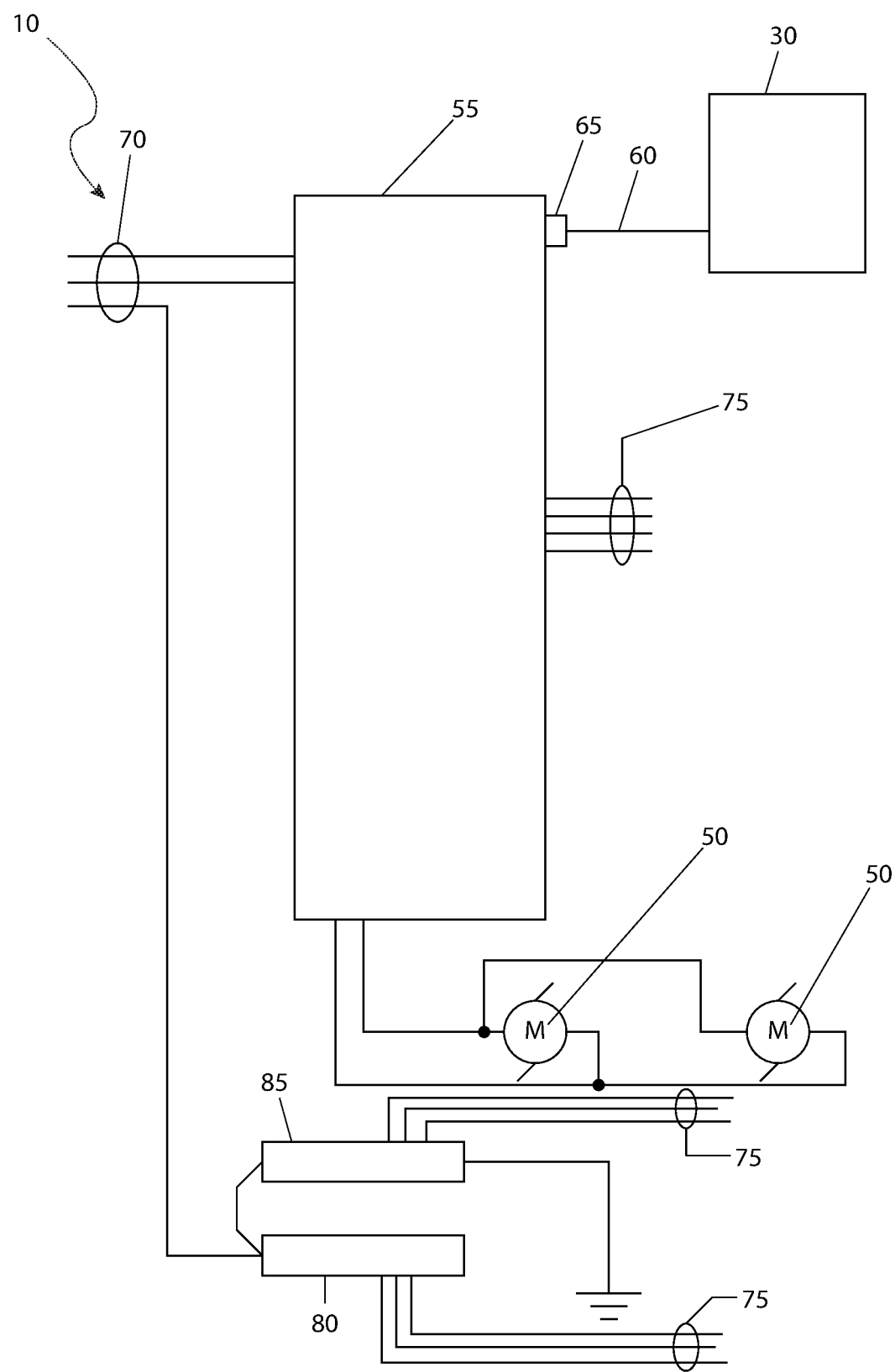

Referring now to FIG. 5, an electrical block diagram of the electrical distribution panel with touch screen control 10, according to the preferred embodiment of the present invention is depicted. The incoming power arrives via the incoming power wiring 70 and energizes the monitoring and control features of the wiring interface unit 55. The touch screen display 30 is connected to the wiring interface unit 55 via the interconnect cable 60 and the quick release electrical connector 65. The electric fan(s) 50 receive power from the wiring interface unit 55. The neutral connection terminal 80 and ground connection terminal 85 provided necessary neutral, ground and bonding connections as required by local codes. Finally, all outgoing branch wiring 75, all protected by and exit from, the wiring interface unit 55, the neutral connection terminal 80 and ground connection terminal 85 as necessary.

Figure 6:
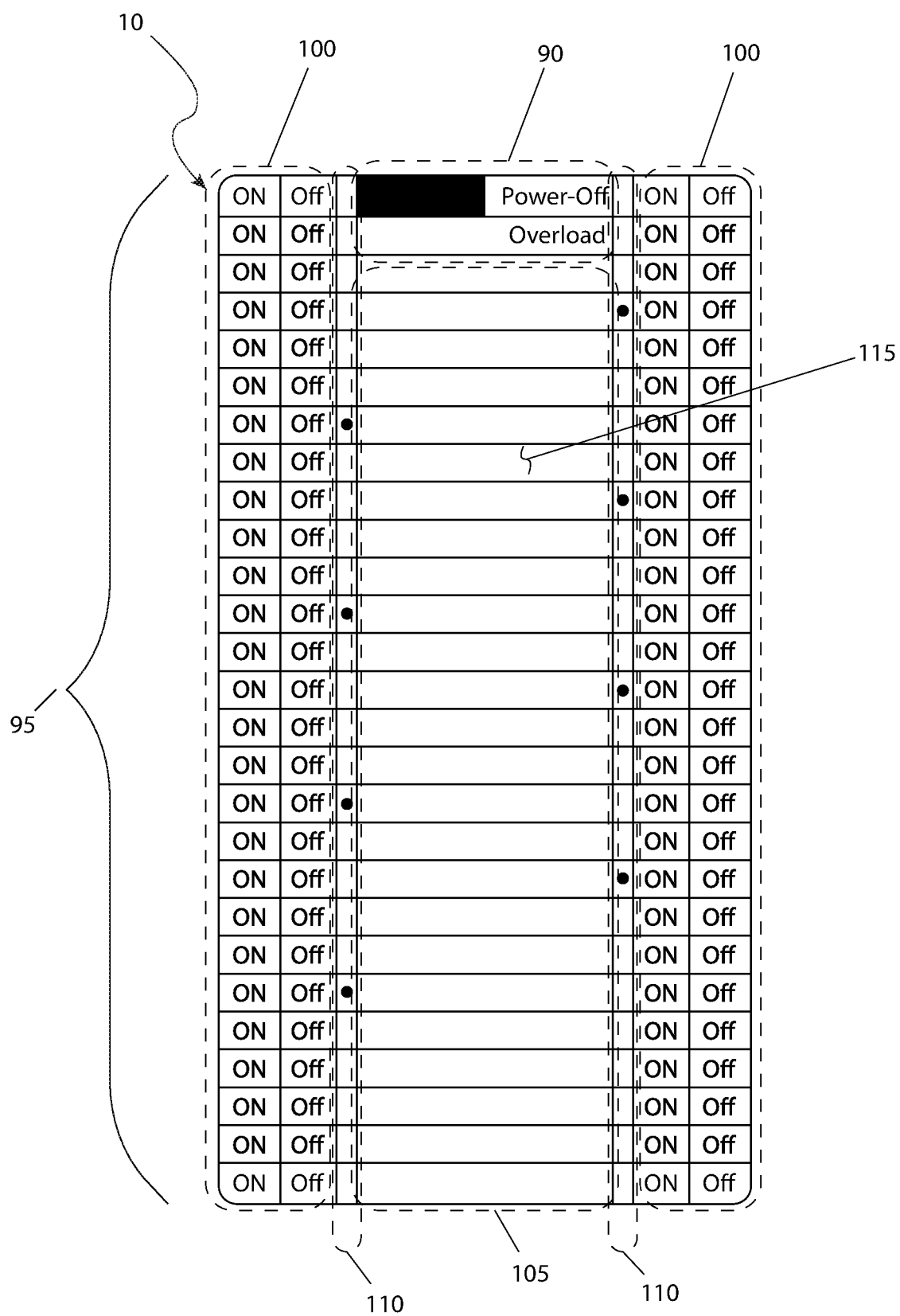

Referring finally to FIG. 6 a pictorial representation of the touch screen display 30 as used with the electrical distribution panel with touch screen control 10, according to the preferred embodiment of the present invention is shown. Said diagram is representative of one possible graphical representation of the control philosophy of the panel 10. Other interpretations, functioning equally as well, are possible, and as such, the pictorial representation of the FIG. 6 should not be interpreted as a limiting factor of the present invention. A main circuit icon 90 is located at the top of the screen display 95. Prominent ON/OFF icons 100 are displayed for the main circuit icon 90 as well as each of the branch circuit icons 105. A fault icon 110, envisioned to be in a prominent color such as red, indicates circuits that display abnormal loads such as overloads, short circuits, ground fault imbalances, arc-fault signatures or the like. A center graphical display area 115 can provide indication such as circuit feed designation, fault condition, and the like.

2. OPERATION OF THE PREFERRED EMBODIMENT

Among the many dangers present in any home, the risk of injury or death caused by accidents involving electricity and electrical devices is among the most common. The common power distribution panel in a home or business provides all associated branch circuits with disconnecting ability, overcurrent protection, short circuit protection, ground fault protection, and in some even cases arc-fault protection. It provides this by using circuit breakers in newer installations or fuses that were commonly used years ago. To disconnect or energize branch circuits connected to such panels, the user must open the panel door and physically touch the circuit breaker or fuse. While normally a safe process, accidents do happen and the user may be exposed to lethal levels of energy and/or high temperatures from breakers that are under high current conditions but do not trip due to an internal malfunction. Accordingly, there exists a need for a means by which users accessing a power distribution panel can be protected from physical dangers. The development of the electrical distribution panel with touch screen control 10 fulfills this need.

The preferred embodiment of the present invention can be utilized by the common user in a simple and effortless manner with little or no training. It is envisioned that the electrical distribution panel with touch screen control 10 would be constructed in general accordance with FIG. 1 through FIG. 5. The user would procure the electrical distribution panel with touch screen control 10 via conventional procurement channels such as electrical supply houses, home improvement stores, internet and mail order supply houses and the like. Special attention would be paid to overall size of the rear box 20, ampacity acceptance of the incoming power wiring 70, number and ampacity acceptance of the outgoing branch wiring 75, and other electrical and physical factors.

After procurement and prior to utilization, the electrical distribution panel with touch screen control 10 would be prepared in the following manner: the panel 10 would be installed in much the same manner as other electrical load centers; the rear box 20 would be installed in a flush or surface manner to a suitable vertical surface, following local electrical codes; the incoming power wiring 70 would be connected to the wiring interface unit 55, the outgoing branch wiring 75 would be connected to the wiring interface unit 55; the rear panel assembly 45 would be connected to the wiring interface unit 55 using the interconnect cable 60 and the quick release electrical connector 65; and the front face 15 would be fastened to the face of the rear box 20 using supplied fasteners 25. At this point in time, the panel 10 is ready for operation.

During utilization of the electrical distribution panel with touch screen control 10, the following procedure would be initiated: the panel 10, under normal operation, operates in a transparent manner with respect to the user. In the event of an electrical abnormality, including but not limited to overloads, short circuits, ground fault imbalances, or arc-fault signatures result in the instantaneous disconnection of the corresponding outgoing branch wiring 75. The user is then alerted to the outage whereupon a visit to the panel 10 will inform them of the situation via the touch screen display 30. Upon correction of the abnormality, the corresponding outgoing branch wiring 75 may be reactivated by a simple touch to the corresponding ON/OFF icons 100 on the respective branch circuit icons 105. At this point in time, the panel 10 is returned to normal operation.

The enhancements afforded by the panel 10 over conventional load centers with possible exposed faulty circuit breakers and/or fuses are as follows: a gentle tap on the touch screen display 30 allows circuits to be open or closed; colorful screen display 95 allows for ready indication of problem areas; the user is not exposed to any potential surfaces or components that could be energized or pose a thermal or arcing hazard; and any faults that may occur are safely contained behind the front face 15 without worry of a hinged door that was left open.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. Therefore, the scope of the invention is to be limited only by the following claims:

The invention claimed is:

1. An electrical distribution panel with touch screen control, comprising:
    a front face attached to a rear box by a plurality of fasteners, the rear box is face mounted on a wall;
    one or more ventilation openings located at an upper end of a touch screen display, the touch screen display is provided with a rear panel assembly on an interior of the rear box and is attached to the front face;
    a plurality of knockouts allowing for passage of a branch circuit and control wiring;
    a pair of electric fans disposed on a bottom of the rear box;
    a wiring interface unit disposed on the interior of the front face which accepts incoming power feeds, the wiring interface unit provides for monitoring and control of a plurality of outgoing branch circuit and control wiring, a plurality of incoming power wiring enters the rear box from its top and accesses the wiring interface unit, the electric fans receive power from the wiring interface unit, the pair of electric fans work with a pair of the ventilation openings at the top of the rear box to provide adequate air flow for cooling of the wiring interface unit as well as the rear panel assembly;

a main circuit icon located at the top of the screen display;
a plurality of ON/OFF icons displayed for the main circuit icon and a plurality of branch circuit icons;
a fault icon indicating a plurality of circuits that display abnormal loads; and
a center graphical display area providing indication;
wherein the electrical distribution panel with touch screen control allows access through the touch screen display;
wherein the fasteners are a plurality of machine screws;
wherein the one or more opposite ventilation openings are disposed on a far side of the rear box; and
wherein the fault icon is a prominent color.

2. The electrical distribution panel with touch screen control, according to claim 1, wherein an interior of the rear box is only intended for access by one or more electricians.

3. The electrical distribution panel with touch screen control, according to claim 1, wherein the wiring interface unit is interconnected to the rear panel assembly by use of a quick release electrical connector to allow for disconnection of the touch screen display.

4. The electrical distribution panel with touch screen control, according to claim 3, wherein the wiring interface unit is interconnected to the rear panel assembly by use of the quick release electrical connector to allow for disconnection of the rear panel assembly when the front face needs to be accessed.

5. The electrical distribution panel with touch screen control, according to claim 1, wherein the touch screen display is connected to the wiring interface unit via the interconnect cable and the quick release electrical connector.

6. The electrical distribution panel with touch screen control, according to claim 1, wherein the incoming power wiring is phase wiring selected from the group consisting of a single phase wiring, a split phase wiring, or a three-phase wiring.

7. The electrical distribution panel with touch screen control, according to claim 1, wherein the outgoing branch wiring is connecting to the wiring interface unit as one or more non-grounded conductors.

8. The electrical distribution panel with touch screen control, according to claim 1, wherein the outgoing branch wiring is connecting to a neutral connection terminal and a ground connection terminal.

9. The electrical distribution panel with touch screen control, according to claim 8, wherein the neutral connection terminal and the ground connection terminal are bonded together if the electrical distribution panel serves as a service entrance.

10. The electrical distribution panel with touch screen control, according to claim 1, wherein the wiring interface unit provides over-current protection for the outgoing branch wiring.

11. The electrical distribution panel with touch screen control, according to claim 1, wherein the wiring interface unit provides ground-fault protection for the outgoing branch wiring.

12. The electrical distribution panel with touch screen control, according to claim 1, wherein the wiring interface unit provides arc-fault protection for the outgoing branch wiring.

13. The electrical distribution panel with touch screen control, according to claim 1, wherein the wiring interface unit provides disconnecting means for the outgoing branch wiring.

14. The electrical distribution panel with touch screen control, according to claim 1, wherein the abnormal loads are selected from the group consisting of overloads, short circuits, ground fault imbalances, or arc-fault signatures.

15. The electrical distribution panel with touch screen control, according to claim 1, wherein the center graphical display area provides indication such as circuit feed designation.

16. The electrical distribution panel with touch screen control, according to claim 1, wherein the center graphical display area provides indication such as fault condition.

* * * * *